United States Patent
Egami et al.

(10) Patent No.: US 11,599,484 B2
(45) Date of Patent: Mar. 7, 2023

(54) SEMICONDUCTOR DEVICE HAVING PLURAL SIGNAL BUSES FOR MULTIPLE PURPOSES

(71) Applicant: MICRON TECHNOLOGY, INC., Boise, ID (US)

(72) Inventors: Kyoka Egami, Yokohama (JP); Hayato Oishi, Hachioji (JP); Mitsuki Koda, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 17/108,973

(22) Filed: Dec. 1, 2020

(65) Prior Publication Data

US 2022/0171722 A1    Jun. 2, 2022

(51) Int. Cl.
*G06F 13/16* (2006.01)
*G11C 7/10* (2006.01)

(52) U.S. Cl.
CPC ........ *G06F 13/1684* (2013.01); *G11C 7/1009* (2013.01); *G11C 7/1048* (2013.01)

(58) Field of Classification Search
CPC ............. G06F 13/1684; G06F 13/4018; G06F 13/1678; G11C 7/1009; G11C 7/1048
USPC ................................................. 710/305, 307
See application file for complete search history.

(56) References Cited

U.S. PATENT DOCUMENTS

| | | | | |
|---|---|---|---|---|
| 5,210,716 A | * | 5/1993 | Takada ................. | G11C 16/349 365/185.21 |
| 5,422,858 A | * | 6/1995 | Mizukami ............... | G11C 8/16 365/220 |
| 5,499,215 A | * | 3/1996 | Hatta ...................... | G11C 7/10 365/230.09 |
| 6,167,487 A | * | 12/2000 | Camacho ............. | G11C 7/1018 711/149 |
| 7,099,969 B2 | * | 8/2006 | McAfee ............. | G06F 13/4022 710/313 |
| 7,480,831 B2 | * | 1/2009 | McAfee ............. | G06F 11/2017 714/E11.015 |
| 7,539,801 B2 | * | 5/2009 | Xie ..................... | G06F 13/4221 710/301 |
| 7,542,324 B1 | * | 6/2009 | Choe .................... | G11C 7/1006 365/198 |
| 7,711,886 B2 | * | 5/2010 | Foster, Sr. ............ | G06F 13/409 710/313 |
| 7,934,032 B1 | * | 4/2011 | Sardella ............. | G06F 13/4022 710/316 |
| 8,601,196 B2 | * | 12/2013 | Sun ....................... | G06F 13/409 710/104 |
| 9,330,031 B2 | * | 5/2016 | Gupta .................... | G06F 12/12 |
| 10,210,128 B2 | * | 2/2019 | Gay ..................... | G06F 13/426 |

(Continued)

*Primary Examiner* — Paul R. Myers
(74) *Attorney, Agent, or Firm* — Dorsey & Whitney LLP

(57) ABSTRACT

Disclosed herein is a method for designing a semiconductor device, the method including: assigning a plurality of wiring tracks including first and second tracks; connecting a first data I/O circuit to a first data node of a first circuit by a first signal bus arranged on the first wiring track; connecting a second data I/O circuit to a second data node of the first circuit by a second signal bus arranged on the second wiring track when a first design mode is selected; and connecting the first data I/O circuit to a second circuit by a second signal bus arranged on the second wiring track when a second design mode is selected.

20 Claims, 11 Drawing Sheets

(56) References Cited

U.S. PATENT DOCUMENTS

| | | | | |
|---|---|---|---|---|
| 10,545,901 B2* | 1/2020 | Seiler | .................. | G06F 13/1678 |
| 2008/0151656 A1* | 6/2008 | Nakai | .................. | G11C 11/5678 |
| | | | | 365/163 |
| 2009/0034337 A1* | 2/2009 | Aritome | .............. | G11C 11/5642 |
| | | | | 365/185.18 |
| 2009/0089646 A1* | 4/2009 | Hirose | ................. | G11C 7/1012 |
| | | | | 714/766 |
| 2010/0077139 A1* | 3/2010 | Gregorius | ............ | G06F 13/1663 |
| | | | | 711/149 |
| 2010/0262790 A1* | 10/2010 | Perego | ................. | G11C 7/1072 |
| | | | | 711/E12.001 |
| 2010/0264816 A1* | 10/2010 | Cok | .................... | H01L 27/3255 |
| | | | | 313/506 |
| 2016/0092383 A1* | 3/2016 | Bains | ................... | G06F 13/287 |
| | | | | 710/308 |
| 2018/0189219 A1* | 7/2018 | Kim | ........................ | G06F 13/12 |

\* cited by examiner

SEMICONDUCTOR DEVICE HAVING PLURAL SIGNAL BUSES FOR MULTIPLE PURPOSES

BACKGROUND

There is a case where a semiconductor device such as a DRAM is designed to be switchable to a plurality of operation modes by changing mask or switching a fuse when it is manufactured. For example, there is a semiconductor device designed to allow switching of the number of data I/O terminals that are used for inputting and outputting data. In this case, a part of read/write buses may become unused depending on the number of the data I/O terminals to be used.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
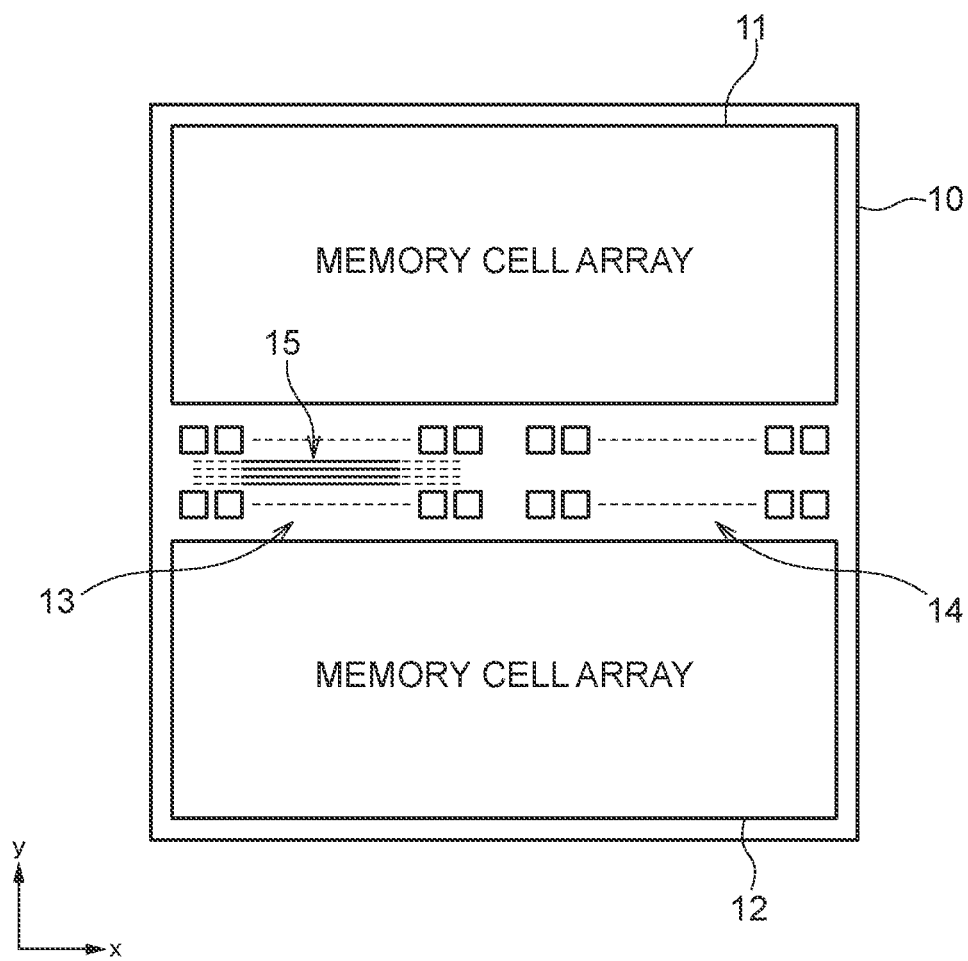
FIG. 1 is a schematic plan view of a semiconductor device according to the present disclosure.
Figure 2A:
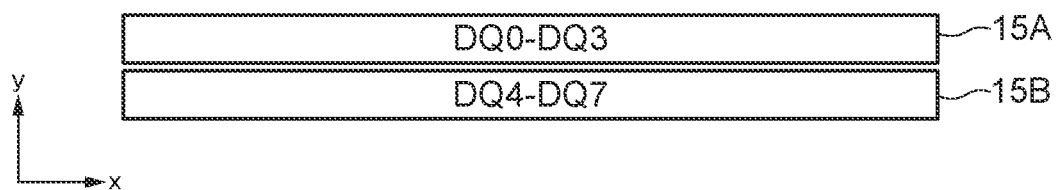
FIGS. 2A to 2C are schematic diagrams for explaining how a plurality of tracks on which read/write buses are formed are used.

A semiconductor device 10 shown in FIG. 1 includes memory cell arrays 11 and 12, a plurality of data I/O terminals 13, and a plurality of command/address input terminals 14. The data I/O terminals 13 and the command/address input terminals 14 are located in a center portion in the y-direction of the semiconductor device 10 and are arranged in the x-direction. Read/write buses 15 extending in the x-direction are provided in the center portion in the y-direction of the semiconductor device 10. As shown in FIG. 2A, the read/write buses 15 include a plurality of tracks 15A assigned to input/output data DQ0 to DQ3 and a plurality of tracks 15B assigned to input/output data DQ4 to DQ7. The tracks all extend in the x-direction in parallel to each other and are located in the same wiring layer. The cross-sectional area of the read/write bus 15 formed on each track is equal to that of the read/write bus 15 on another track.

The semiconductor device 10 according to the present embodiment is designed to be switchable to a plurality of operation modes by changing mask when being manufactured. A first operation mode is designed for a single die package. In a case where the first operation mode is selected, the number of data I/O terminals 13 used for inputting and outputting data can be also changed. For example, either a mode using eight of the data I/O terminals 13 (an x8 operation mode) or a mode using four of the data I/O terminals 13 (an x4 operation mode) can be selected. A second operation mode is designed for a three-dimensional stack (hereinafter "3D-stack" or "3DS") package. In a 3D-stack package, a plurality of the semiconductor devices 10 are stacked, a lowermost semiconductor device 10 serves as a master chip, and the remaining semiconductor devices 10 serve as slave chips. In the second operation mode, an operation is performed in the mode that uses four of the data I/O terminals 13 (the x4 operation mode).

Figure 3A:
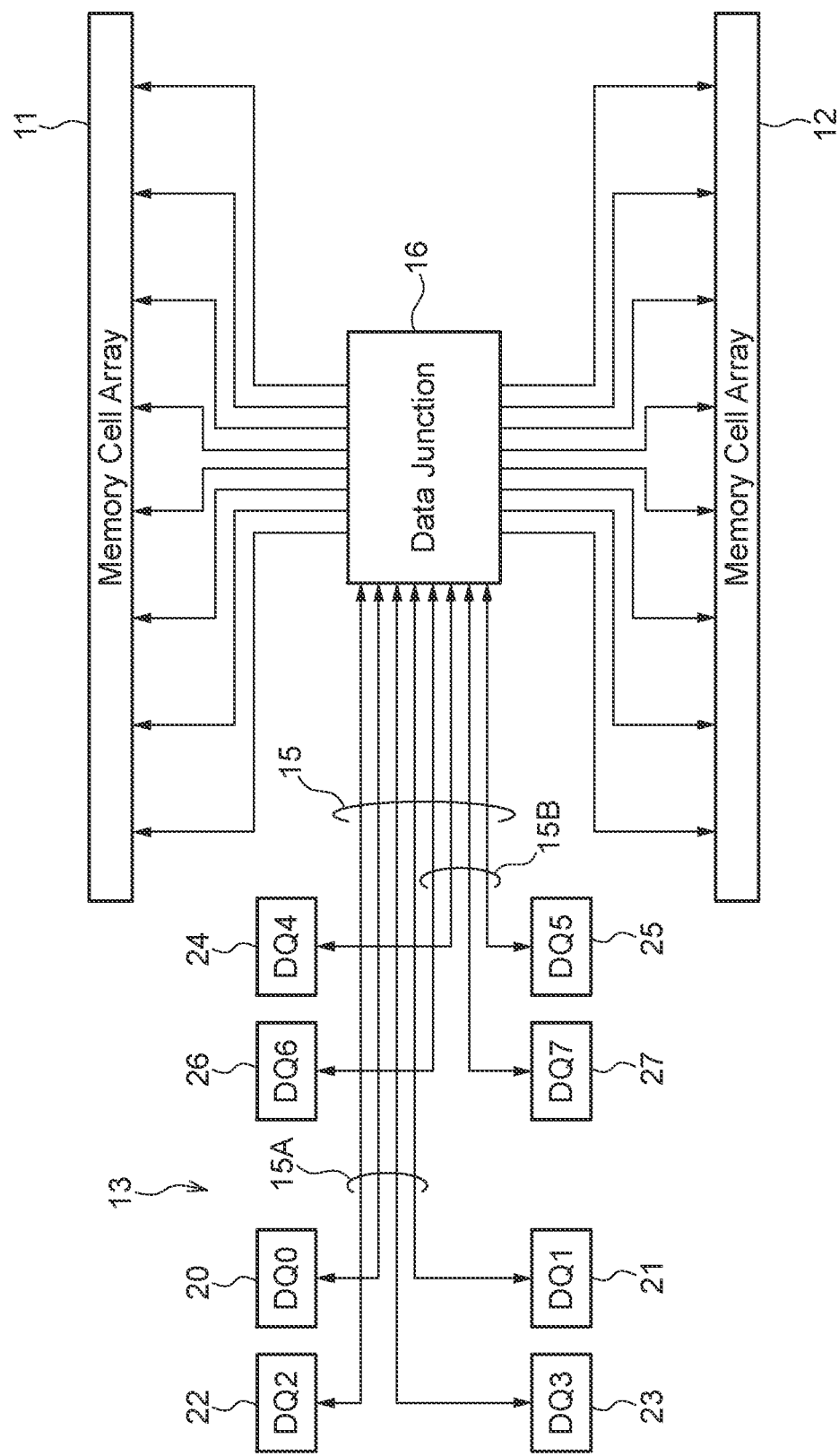
FIGS. 3A and 3B are schematic diagrams for explaining how read/write buses are used when an x8 operation mode is selected in a first operation mode.

In a case where the x8 operation mode is selected in the first operation mode, as shown in FIG. 3A, data I/O circuits 20 to 27 respectively corresponding to input/output data DQ0 to DQ7 are connected to a data junction circuit 16 via the read/write buses 15. The data junction circuit 16 controls transmission and reception of read data and write data between the data I/O circuits 20 to 27 and each of the memory cell arrays 11 and 12.

Figure 4:
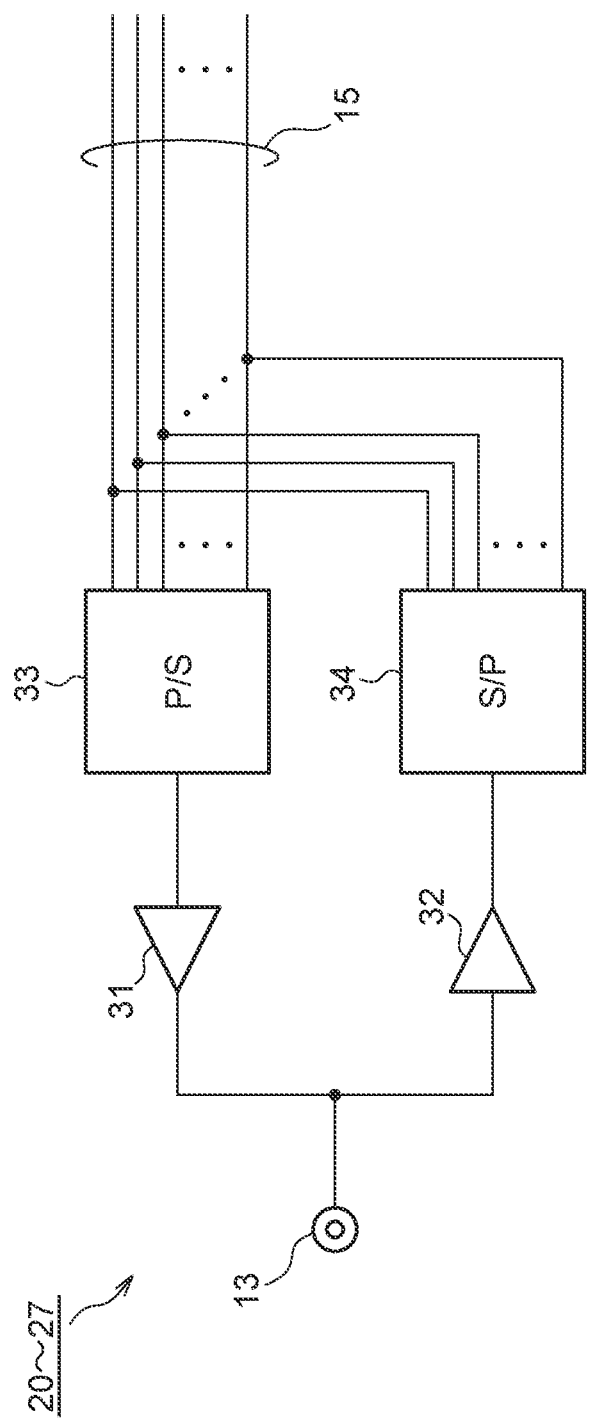
FIG. 4 is a block diagram for explaining a circuit configuration of a data I/O circuit.

As shown in FIG. 4, the data I/O circuit 20 to 27 each include a corresponding one of the data I/O terminals 13, an output buffer 31 and an input receiver 32 both connected to the data I/O terminal 13, a parallel/serial conversion circuit 33 connected to the output buffer 31, and a serial/parallel conversion circuit 34 connected to the input receiver 32. The parallel/serial conversion circuit 33 converts parallel read data DQ supplied from the data junction circuit 16 via the read/write buses 15 to serial data and supplies the serial data to the output buffer 31. The serial/parallel conversion circuit 34 converts serial write data DQ output from the input receiver 32 to parallel data and supplies the parallel data to the read/write buses 15. The data I/O circuits 20 to 23 corresponding to the input/output data DQ0 to DQ3 are connected to the data junction circuit 16 via the read/write buses 15 wired on the tracks 15A, and the data I/O circuits 24 to 27 corresponding to the input/output data DQ4 to DQ7 are connected to the data junction circuit 16 via the read/write buses 15 wired on the tracks 15B. That is, as shown in FIG. 2A, the read/write buses 15 on both the tracks 15A and 15B are used for inputting and outputting data.

Figure 3B:
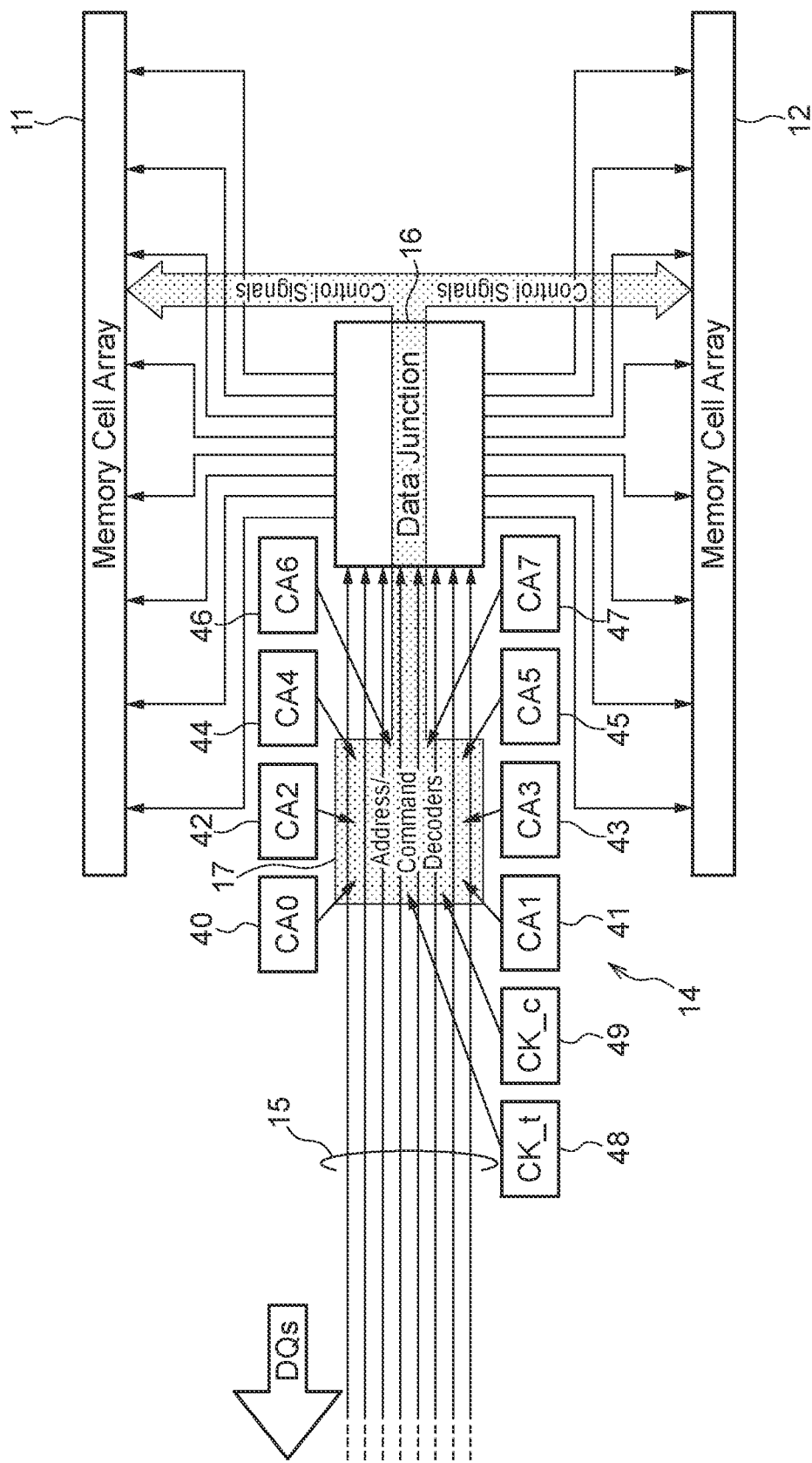

In a case where the x8 operation mode is selected in the first operation mode, as shown in FIG. 3B, command/address signals input via command/address input circuits 40 to 49 are input to a command/address decoder 17. Each of the command/address circuits 40 to 49 includes a corresponding one of the command/address terminals 14. In the example shown in FIG. 3B, command address signals CA0 to CA7 are input to the command/address input circuits 40 to 47, and complementary clock signals CK_t and CK_c are input to the command/address input circuits 48 and 49, respectively. The command/address decoder 17 decodes the command/address signals CA0 to CA7 in synchronization with the clock signals CK_t and CK_c, thereby generating an internal command and an internal address. The internal command and the internal address are supplied to the memory cell arrays 11 and 12.

Figure 2B:
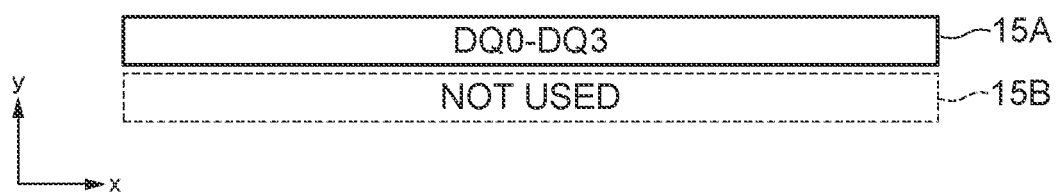
Figure 5A:
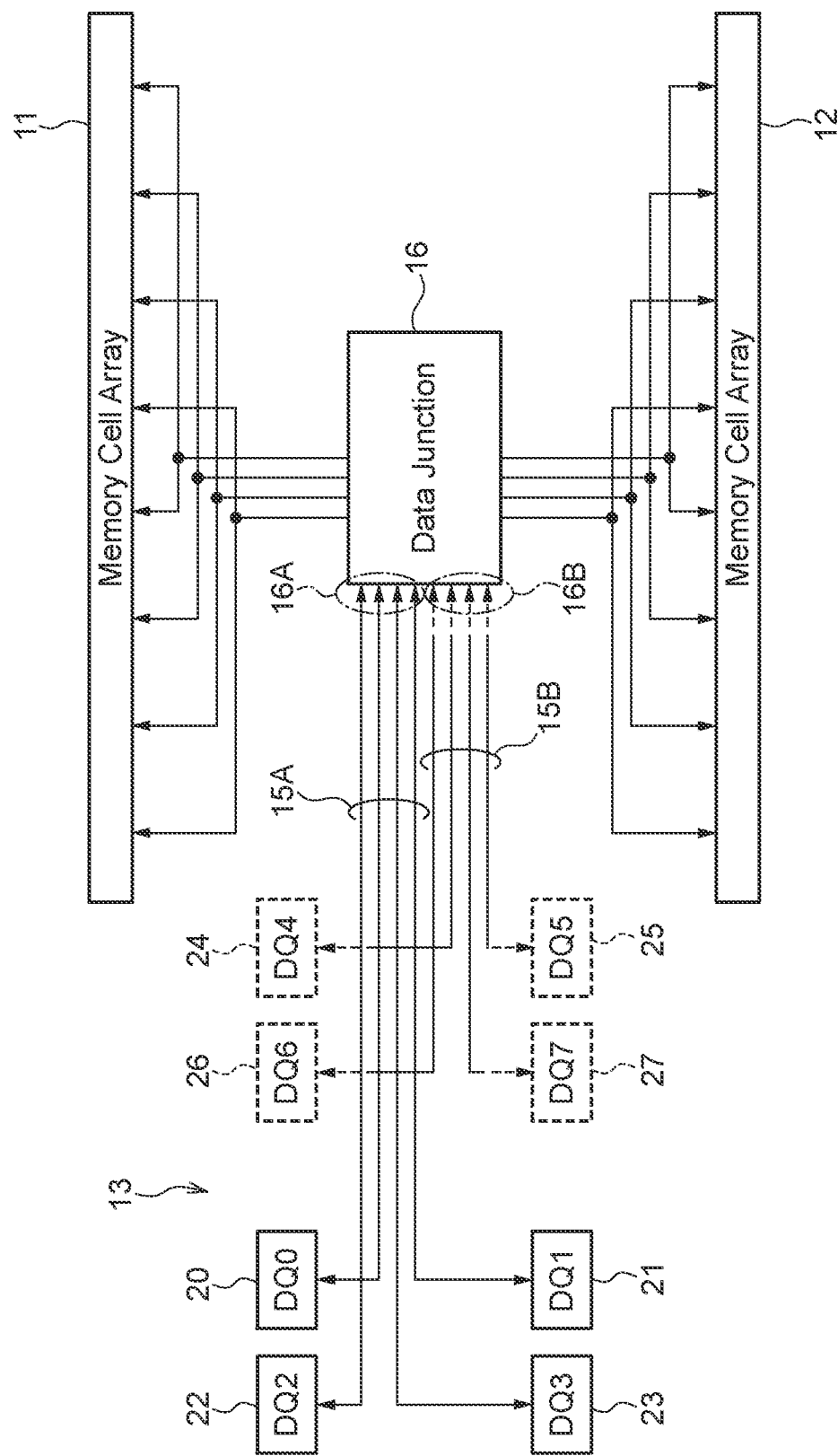
FIGS. 5A and 5B are schematic diagrams for explaining how read/write buses are used when an x4 operation mode is selected in the first operation mode.
Figure 5B:
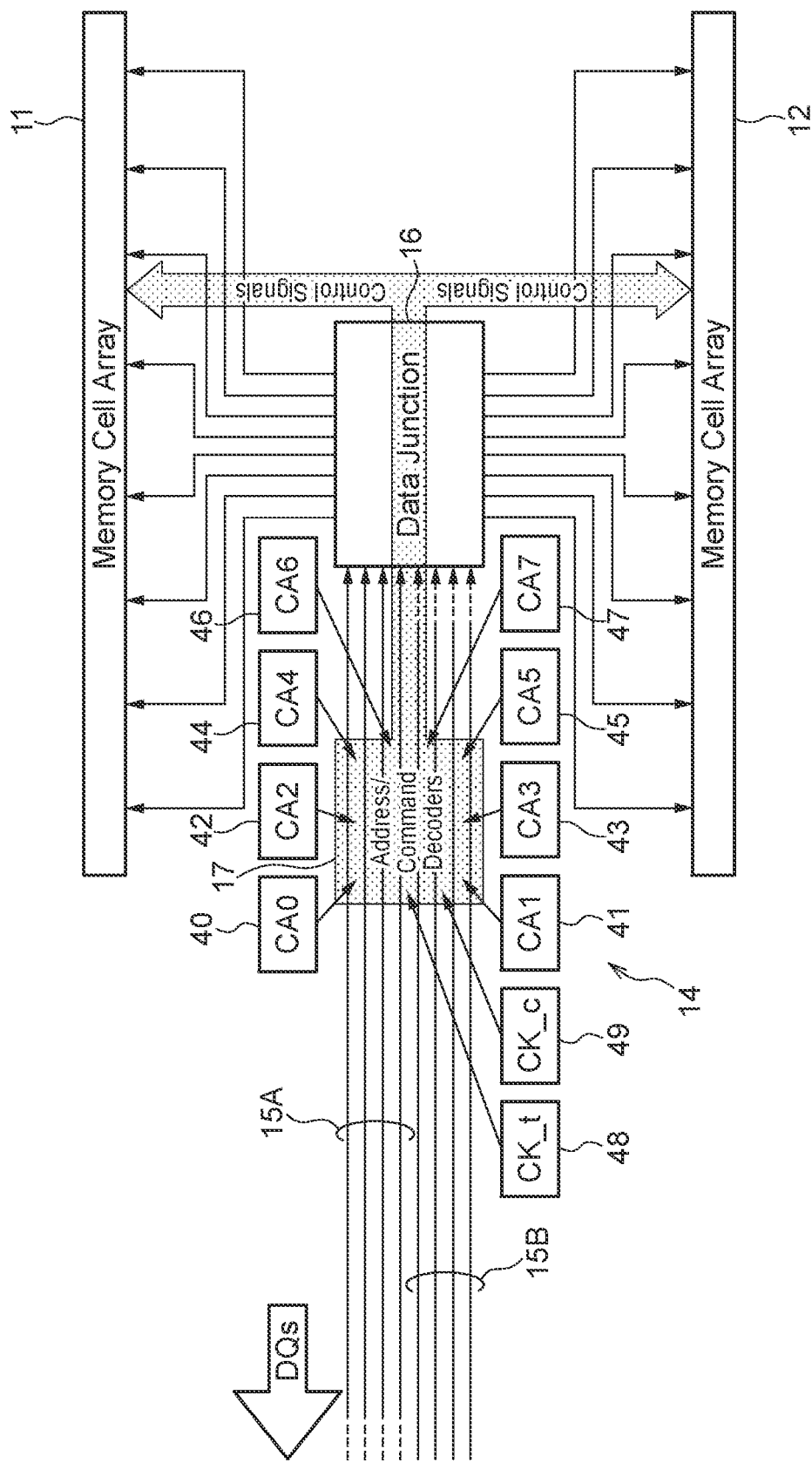

In a case where the x4 operation mode is selected in the first operation mode, as shown in FIG. 5A, the data I/O circuits 20 to 23 respectively corresponding to the input/output data DQ0 to DQ3 are connected to the data junction circuit 16 via the read/write buses 15 wired on in the tracks 15A. The data I/O circuits 24 to 27 corresponding to the input/output data DQ4 to DQ7 are not used. That is, as shown in FIG. 2B, the tracks 15A in the read/write buses 15 are used for inputting and outputting data and the tracks 15B are not used. As shown in FIG. 5B, connection between the command/address input circuits 40 to 49 and the command/address decoder 17 is identical to that in the case where the x8 operation mode is selected in the first operation mode. The read/write buses 15 on the unused tracks 15B may be disconnected near the data I/O circuits 24 to 27 and near the data junction circuit 16. In this case, the data junction circuit 16 inputs and outputs data via nodes 16A respectively connected to the read/write buses 15 on the tracks 15A. Meanwhile, nodes 16B corresponding to the read/write buses 15 on the tracks 15B are deactivated so that input and output of data via the nodes 16B cannot be performed.

As described above, in the first operation mode, both the tracks 15A and 15B are used for inputting and outputting data in a case where the x8 operation mode is selected, and only the tracks 15A are used for inputting and outputting data in a case where the x4 operation mode is selected.

Figure 6:
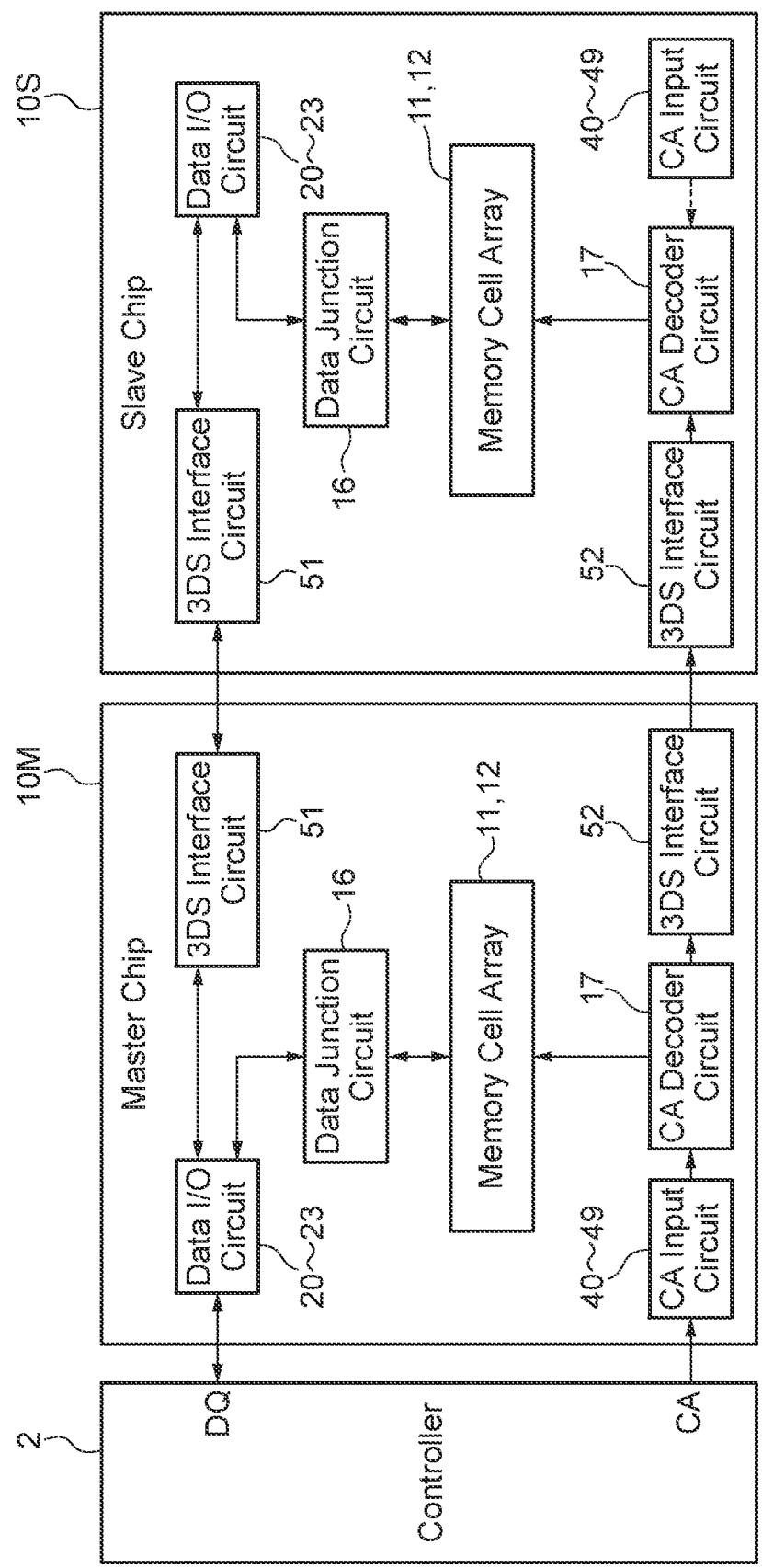
FIG. 6 is a block diagram for explaining a connection relation between a master chip and a slave chip.
Figure 7A:
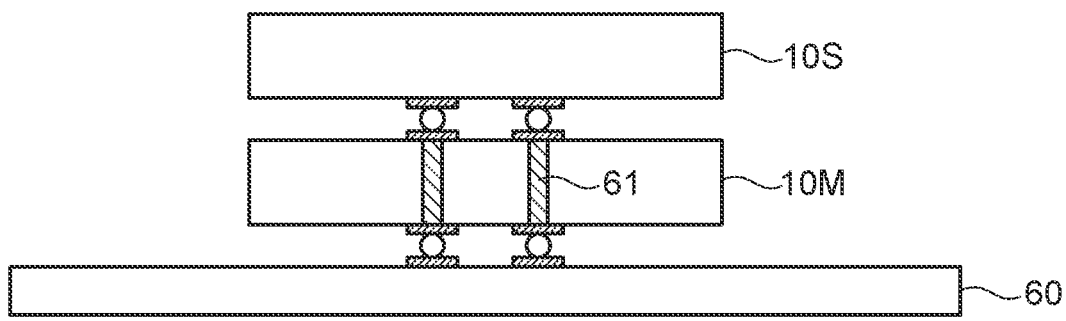
FIGS. 7A and 7B are schematic diagrams for explaining a connecting method of the master chip and the slave chip.
Figure 7B:
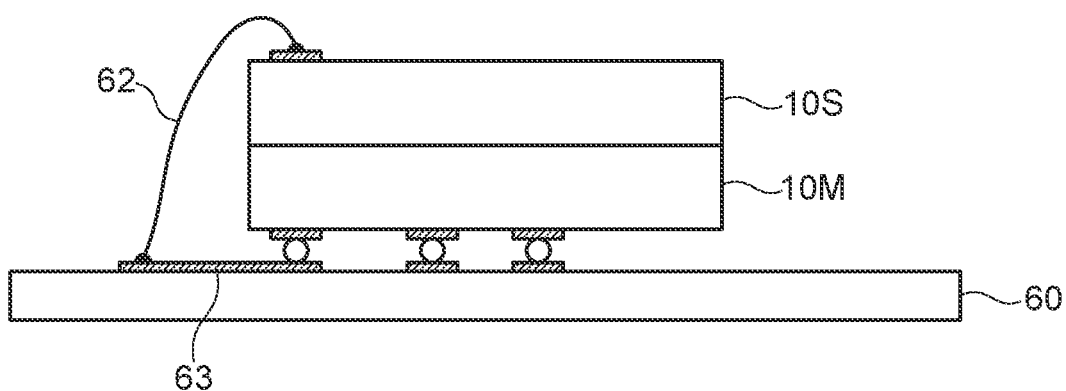

As shown in FIG. 6, in a case where the second operation mode is selected, at least two semiconductor devices 10M and 10S are packaged into a 3D-stack package. The semiconductor device 10M is a master chip and the semiconductor device 10S is a slave chip. The semiconductor device 10M as a master chip is connected directly to a controller 2, whereas the semiconductor device 10S as a slave chip is connected to the controller 2 via the master chip. The semiconductor devices 10M and 10S are stacked on a substrate 60 as shown in FIGS. 7A and 7B. As shown in FIG. 7B, the semiconductor device 10S may be connected to the semiconductor device 10M via a TSV 61 provided to penetrate through the semiconductor device 10M as shown in FIG. 7A, or via a bonding wire 62 and a wiring pattern 63 provided on the substrate 60.

Connection between the semiconductor devices 10M and 10S is made via 3DS interface circuits 51 and 52. The 3DS interface circuit 51 is for data, and the 3DS interface circuit 52 is for command and address. In a case where the semiconductor device 10S performs a write operation, write data DQ0 to DQ3 to be written into the semiconductor device 10S is input from the controller 2 to the data I/O circuits 20 to 23 of the semiconductor device 10M and is then transferred to the data I/O circuits 20 to 23 of the semiconductor device 10S via the 3DS interface circuit 51. Accordingly, the semiconductor device 10S can perform a write operation as if the write data DQ0 to DQ3 is input to its own data I/O circuits 20 to 23. Meanwhile, in a case where the semiconductor device 10S performs a read operation, read data DQ0 to DQ3 read out from the semiconductor device 10S is transferred, via its own data I/O circuits 20 to 23 and the 3DS interface circuit 51, to the data I/O circuits 20 to 23 of the semiconductor device 10M. Accordingly, the controller 2 can receive the read data DQ0 to DQ3 as if the read data DQ0 to DQ3 is output from the semiconductor device 10M.

Command/address signals supplied from the controller 2 are input to the command/address input circuits 40 to 49 of the semiconductor device 10M and are decoded by the command/address decoder 17 in the semiconductor device 10M. In a case where access is made to the semiconductor device 10M, an internal command and an internal address are supplied to the memory cell arrays 11 and 12 in the semiconductor device 10M. Meanwhile, in a case where access is made to the semiconductor device 10S, an internal command and an internal address are supplied to the semiconductor device 10S via the 3DS interface circuit 52. Therefore, the command/address input circuits 40 to 49 are not used in the semiconductor device 10S, which is a slave chip.

Figure 2C:
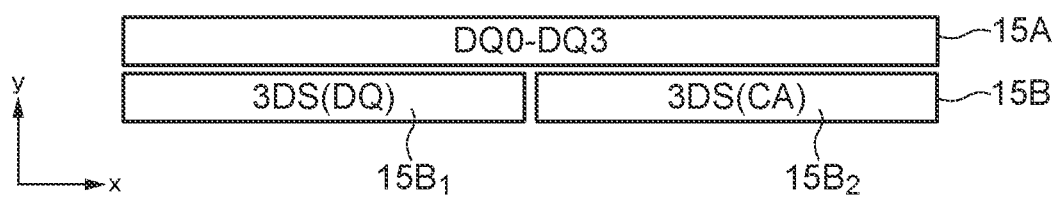
Figure 8A:
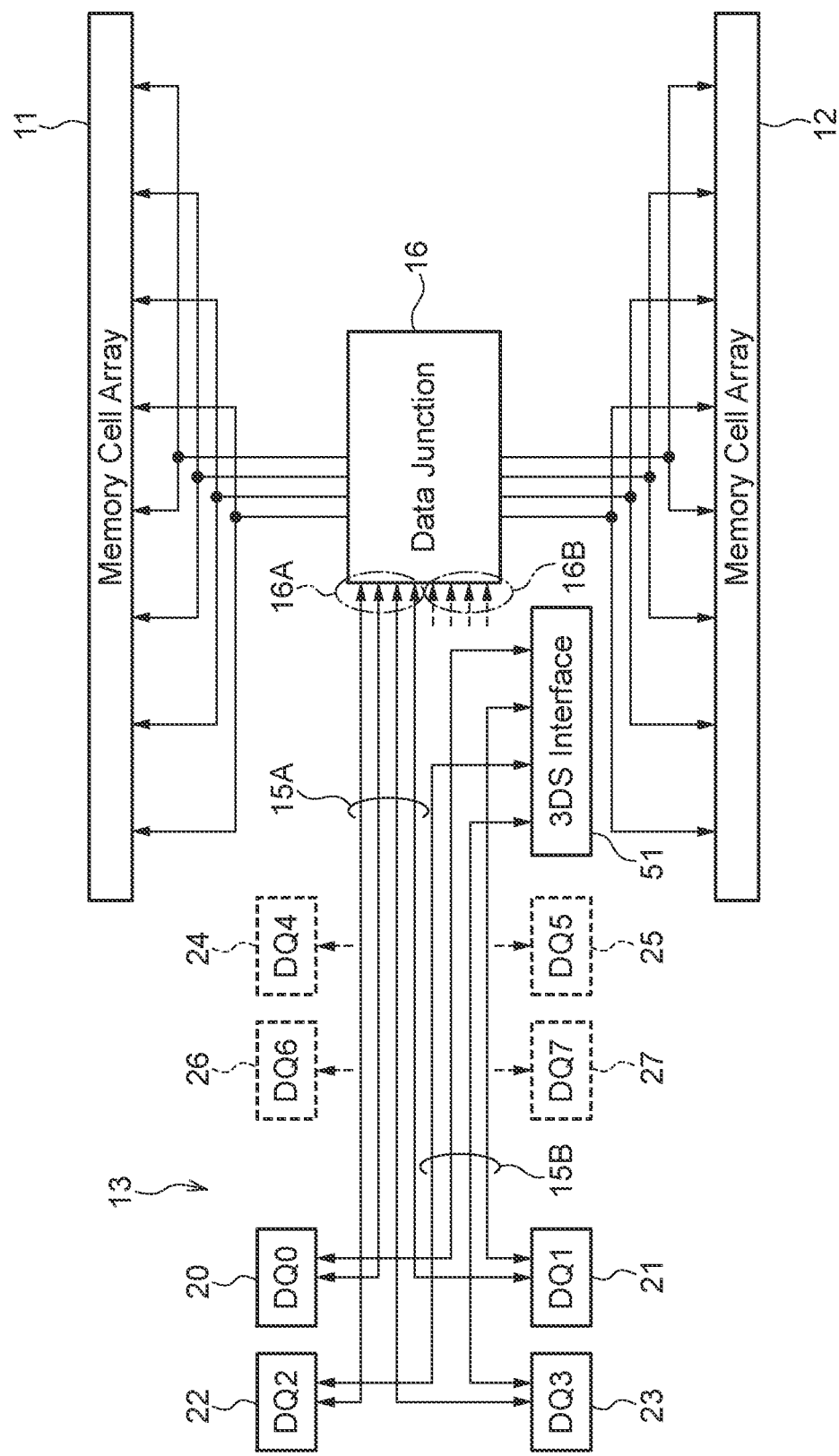
FIGS. 8A and 8B are schematic diagrams for explaining how read/write buses are used in a second operation mode.
Figure 8B:
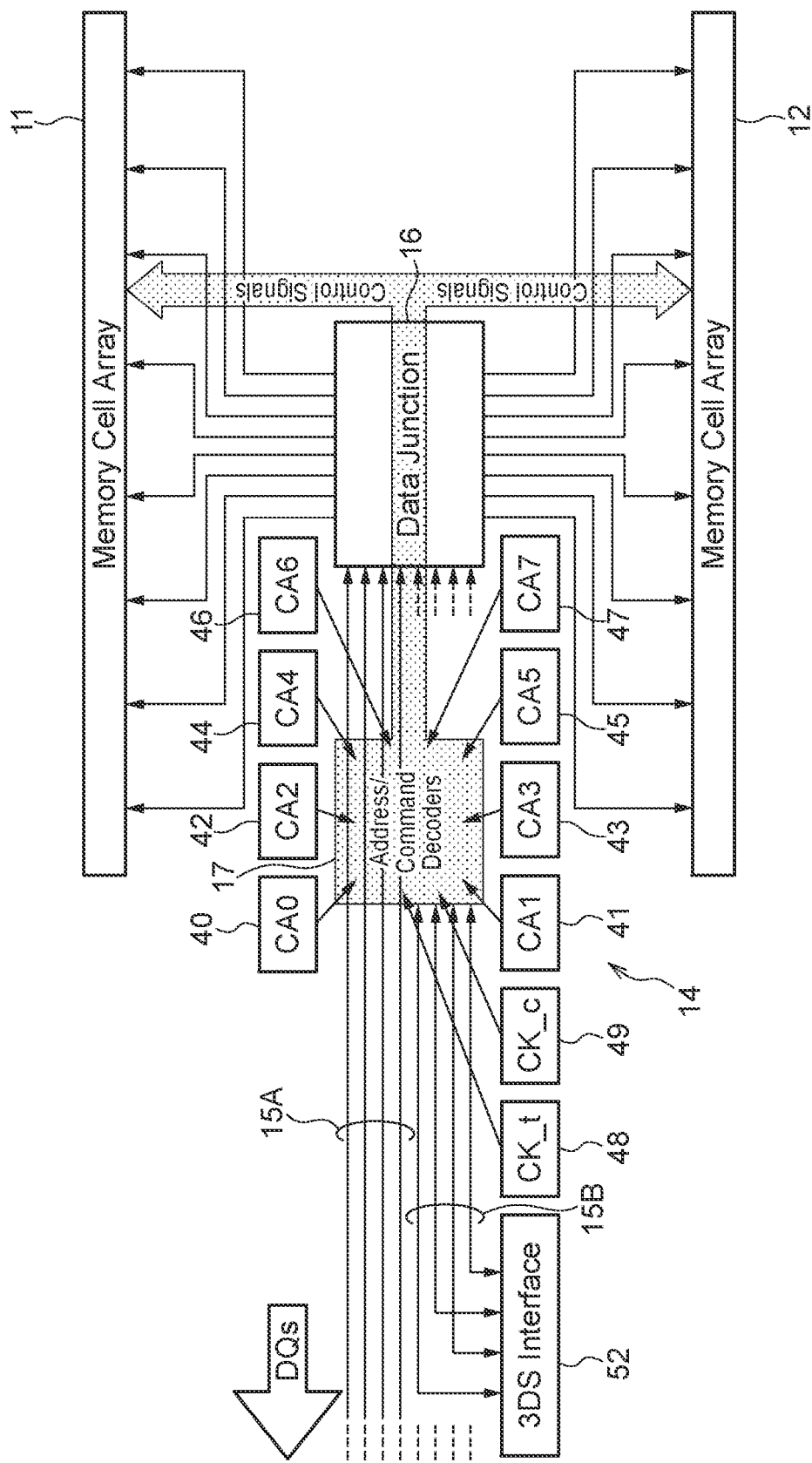

As shown in FIG. 8A, in the second operation mode, the data I/O circuits 20 to 23 corresponding to the input/output data DQ0 to DQ3 are connected to the data junction circuit 16 via the read/write buses 15 wired on the tracks 15A, and are also connected to the 3DS interface circuit 51 via the read/write buses 15 wired on the tracks 15B. The data I/O circuits 24 to 27 are not used and are disconnected from the data junction circuit 16. Further, as shown in FIG. 8B, the command/address decoder 17 is connected to the 3DS interface circuit 52 via the read/write buses 15 wired on the tracks 15B. That is, the tracks 15A in the read/write buses 15 are used for inputting and outputting data to its corresponding semiconductor device 10, a section $15B_1$ of the track 15B is used for data transfer between the corresponding semiconductor device 10 and another semiconductor device 10, and another section $15B_2$ of the track 15B is used for transferring command/address signals between the corresponding semiconductor device 10 and the other semiconductor device 10 as shown in FIG. 2C. The sections $15B_1$ and $15B_2$ of the tracks 15B are shorter than the track 15A. Such switching of wires can be easily achieved by changing a mask pattern in fabrication of the semiconductor device 10.

In the second operation mode, the nodes 16B of the data junction circuit 16 are disconnected from the tracks 15B. That is, the nodes 16B are deactivated so that input and output of data via the nodes 16B cannot be performed.

As described above, in the second operation mode designed for a 3D-stack package, the semiconductor device 10 according to the present embodiment uses the tracks 15B that are not used for inputting and outputting data for the semiconductor device 10, and assigns a portion of those tracks to data transfer and another portion to command/address transfer. Therefore, it is not necessary to add wires for data transfer and command/address transfer separately. Accordingly, it is possible to reduce a chip size while ensuring compatibility between the first operation mode and the second operation mode.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which we within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Tus, it is intended that the scope of at least some of the present invention herein disclosed should not be limited by the particular disclosed embodiments described above.

The invention claimed is:

1. An apparatus comprising:
   a memory cell array;
   a data junction circuit coupled to the memory cell array;
   first and second data I/O circuits each including a data I/O terminal;
   first and second signal buses; and
   a data interface circuit including another data I/O terminal,
   wherein the first data I/O circuit is coupled to the memory cell array via the first signal bus and the data junction circuit,
   wherein the first data I/O circuit is further coupled to the data interface circuit via the second signal bus when a first design mode is selected,
   wherein the second data I/O circuit is disconnected from the data junction circuit so as not to be able to input/output data to/from the memory cell array when the first design mode is selected, and
   wherein the second data I/O circuit is coupled to the memory cell array via the second signal bus and the data junction circuit when a second design mode is selected.

2. The apparatus of claim 1, wherein the first and second signal buses extend in parallel with each other.

3. The apparatus of claim 2, wherein the second signal bus is shorter than the first signal bus.

4. The apparatus of claim 3, wherein the first and second signal buses are located at a same wiring layer as each other.

5. The apparatus of claim 4, wherein the first and second signal buses have a same sectional area as each other.

6. The apparatus of claim 1,
   wherein the data junction circuit has first and second data nodes assigned to the first and second data I/O circuits, respectively,
   wherein the first data node is coupled to the first data I/O circuit via the first signal bus, and
   wherein the second data node is configured to be deactivated so as not to be able to input/output data.

7. The apparatus of claim 1, further comprising:
   a command/address input circuit including a command/address terminal;
   a third signal bus extending in parallel with the first and second signal buses;
   a command/address decoder circuit; and
   a command/address interface circuit including another command/address terminal,
   wherein the command/address decoder circuit is coupled to the command/address input circuit, and
   wherein the command/address decoder circuit is further coupled to the command/address interface circuit via the third signal bus.

8. The apparatus of claim 7, wherein the third signal bus is shorter than the first signal bus.

9. The apparatus of claim 8, wherein the first, second, and third signal buses are located at a same wiring layer as each other.

10. The apparatus of claim 9, wherein the first, second, and third signal buses have a same sectional area as each other.

11. The apparatus of claim 7, wherein the second and third signal buses are arranged at a different wiring track from the first signal bus.

12. The apparatus of claim 11, wherein the second and third signal buses are arranged at a same wiring track as each other.

13. An apparatus comprising:
    a first data I/O circuit including a first data I/O terminal;
    a second data I/O circuit including a second data I/O terminal;
    a third data I/O circuit including a third data I/O terminal;
    a data interface circuit including another data I/O terminal,
    a command/address input circuit including a command/address terminal;
    a command/address interface circuit including another command/address terminal;
    a data control circuit coupled to the data I/O circuit;
    a command/address control circuit coupled to the command/address input circuit;
    a first signal bus arranged on a first wiring track, the first signal bus coupling the data control circuit to the first data I/O circuit;
    a second signal bus arranged on a first section of a second wiring track, wherein the second signal bus couples the data interface circuit to the first data I/O circuit when a first design mode is selected, and wherein the second signal bus couples the data control circuit to the second data I/O circuit when a second design mode is selected; and
    a third signal bus arranged on a second section of the second wiring track, wherein the third signal bus couples the command/address control circuit to the command/address interface circuit when the first design mode is selected, and wherein the third signal bus couples the data control circuit to the third data I/O circuit when the second design mode is selected.

14. The apparatus of claim 13, wherein the first and second wiring tracks extending in parallel with each other.

15. The apparatus of claim 14, wherein first and second wiring tracks are located at a same wiring layer as each other.

16. The apparatus of claim 15, wherein the first, second, and third signal buses have a same sectional area as each other.

17. A method for designing a semiconductor device, the method comprising:
    assigning a plurality of wiring tracks including first and second tracks;
    connecting a first data I/O circuit to a first data node of a first circuit by a first signal bus arranged on the first wiring track;
    connecting a second data I/O circuit to a second data node of the first circuit by a second signal bus arranged on the second wiring track when a first design mode is selected; and
    connecting the first data I/O circuit to a second circuit by the second signal bus arranged on the second wiring track when a second design mode is selected.

18. The method of claim 17, further comprising:
    disconnecting the second data I/O circuit from the first circuit when the second design mode is selected.

19. The method of claim 17, further comprising:
    connecting a command/address control circuit to a third circuit by a third signal bus arranged on the second wiring track when the second design mode is selected.

20. The method of claim 19, further comprising:
    disconnecting the command/address control circuit from the third circuit when the first design mode is selected.

* * * * *